United States Patent [19]
Bastani

[11] Patent Number: 5,893,029
[45] Date of Patent: *Apr. 6, 1999

[54] BASEBAND PHASE-LOCKED DIRECT CONVERSION RECEIVER WITH FREQUENCY OFFSET

[75] Inventor: Babak Bastani, Weston, Fla.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 797,144

[22] Filed: Feb. 10, 1997

[51] Int. Cl.$^6$ ........................................ H04B 1/26
[52] U.S. Cl. ................................. 455/324; 455/260
[58] Field of Search .................... 455/324, 313, 455/255–260, 264, 265, 317; 375/329

[56] References Cited

U.S. PATENT DOCUMENTS

| | | | |
|---|---|---|---|
| 4,523,324 | 6/1985 | Marshall | 455/324 |
| 5,003,621 | 3/1991 | Gailus | 455/324 |
| 5,222,253 | 6/1993 | Heck . | |
| 5,396,521 | 3/1995 | Minami | 455/260 |
| 5,438,692 | 8/1995 | Mohindra | 455/324 |
| 5,584,068 | 12/1996 | Mohindra | 455/324 |

Primary Examiner—Nguyen Vo
Attorney, Agent, or Firm—M. Mansour Ghomeshi

[57] ABSTRACT

To generate a fixed frequency offset in a direct conversion receiver (200) a phase ramp representing the frequency offset if generated. This phase ramp is combined with the demodulated phase component of a received signal. A phase wrap detection and compensation circuit (224) is capable of detecting and compensating for phase wrap that occur in the phase ramp by differentiating the input and detecting when a phase wrap is about to occur and causes a switch (316) to flip between two conditions. A first condition couples the phase ramp to the output. A second condition compensates when a wrap around has been detected. As such, a VCO (218) produces a local oscillator having a fixed frequency offset that is immune from locking problems that occur when a phase wrap is introduced.

8 Claims, 2 Drawing Sheets

BASEBAND PHASE-LOCKED DIRECT CONVERSION RECEIVER WITH FREQUENCY OFFSET

TECHNICAL FIELD

This invention relates in general to radio frequency receivers and more particularly to direct conversion radio frequency receivers.

BACKGROUND

In Zero Intermediate Frequency (ZIF) and Direct Conversion Receivers, it is desirable to phase-lock (or frequency lock) the Local Oscillator (LO) to the incoming signal. This is because phase-locking will allow the receiver to track the central frequency of the incoming signal and eliminates this reference oscillator error (it constraints the offsets and beat notes caused by frequency offset of LO and incoming signal to a subaudible frequency). The phase-locking used with ZIF receivers needs to include a frequency offset which is used to avoid false carrier or self-quieting problem. Indeed, this slight frequency offset is used by a high pass filter centered very close to DC to allow the desired signal to pass through without the DC components that would otherwise be treated as false carriers. To accomplish this objective of locking with a frequency offset, traditional ZIF receivers use up-conversion mixers to increase the frequency from a baseband to an IF and therefore facilitating the phase locking. As can be appreciated, this up-conversion requires mixers and filters which would add to the cost of the receiver. To overcome this problem, a direct conversion receiver is needed that can phase-lock with an incoming signal with a frequency offset without any up-conversion.

DETAILED DESCRIPTION OF THE PREFERRED EMBODIMENT

To phase lock with an incoming carrier signal, Zero IF receivers up-convert baseband signal and proceeds to demodulate the same. This is implemented because of problems associated with phase locking at baseband with a frequency offset. To achieve, a true direct conversion receiver, the demodulation and phase locking must be implemented at baseband, however, it is very difficult to perform baseband phase locking with a frequency offset. In order to be able to phase lock with a fixed frequency offset, it is necessary to generate a ramping phase that is summed with the phase detector output to generate a constant voltage into the voltage controlled oscillator (VCO). The problem occurs when the phase ramp wraps around due to finite voltage swings or finite number of bits available. To overcome this problem, the present invention uses a phase wrap detection and compensation circuit. This circuit prevents operation instability that is introduced into the circuit when the phase wraps, as will be explained in more detail by referring to FIGS. 1–3 where like numerals are carried forward.

Figure 1:
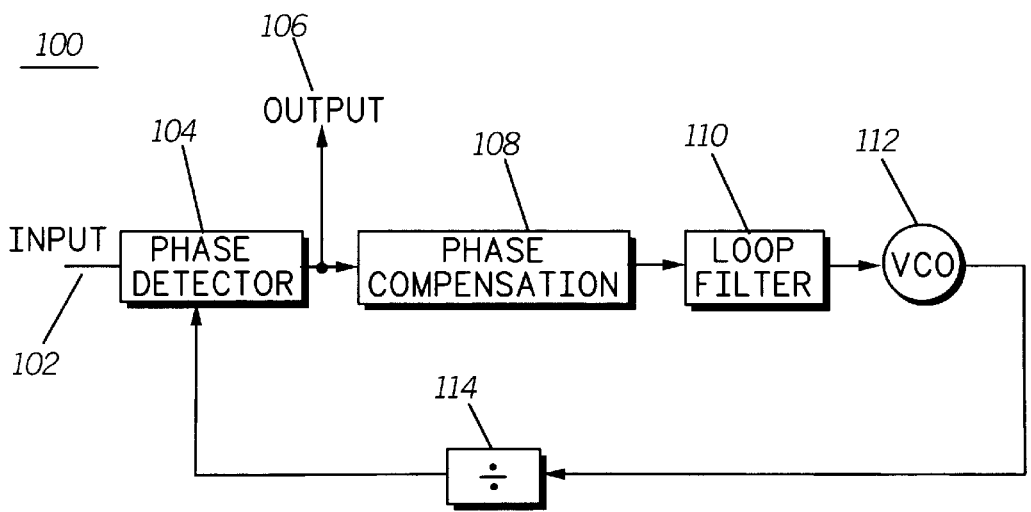
FIG. 1 shows a phase-locked loop in accordance with the present invention.

Referring to FIG. 1, a block diagram of a phase-locked loop is shown utilizing the phase compensation circuit in accordance with the present invention. An input signal 102 is applied to a phase detector 104 whose second input arrives from a divider 114. The phase difference between these two signals is provided at an output 106 and simultaneously to the input of a phase compensation circuit 108. A loop filter 110 removes undesired components from the loop and the VCO 112 provides oscillation for the loop. The phase compensation 108 introduces an offset frequency at the output 106. In other words, the phase detector 104 no longer aims to produce a zero error at output 106 and rather generates an offset. The inventive aspect of this loop will be better understood by referring to a particular embodiment utilizing a receiver in accordance with the present invention.

Figure 2:
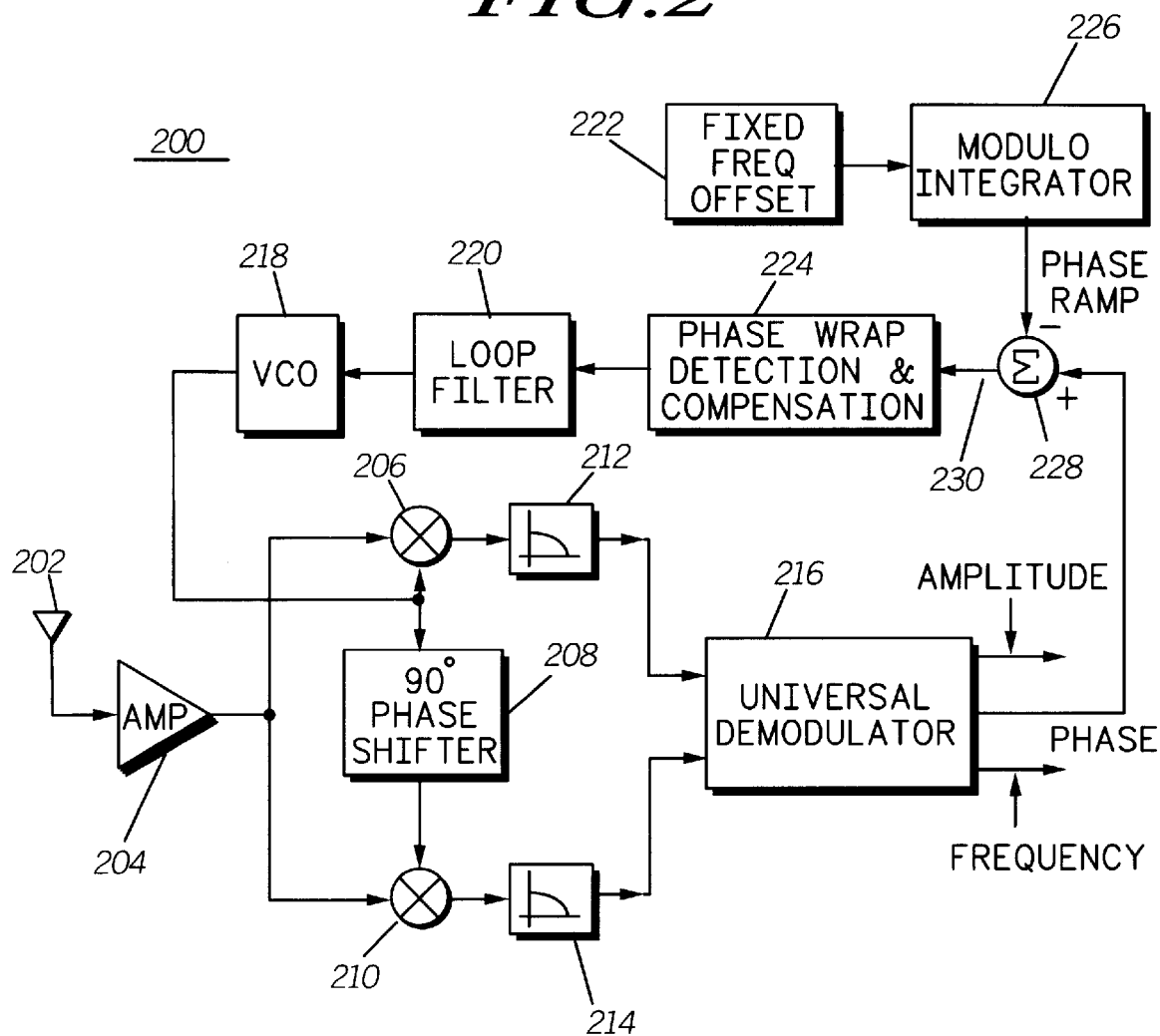
FIG. 2 shows a receiver in accordance with the present invention.

Referring to FIG. 2, a receiver 200 is shown where a phase wrap detection and compensation 224 is utilized to avoid up-converters in the direct conversion processes. A radio frequency signal received at an antenna 202 is amplified by an amplifier 204 and coupled to a quadrature receiver comprising mixers 206 and 210. A phase shifter 208 introduces 90° phase shift in the VCO signal that is applied to the mixer 210. Low pass filters 212 and 214 filter out undesired components at the output of the mixers 206 and 210. The filtered signals are coupled to a universal demodulator 216 which can produce amplitude, phase and, frequency signals. The phase signal is routed to a summing circuit 228 whose second input is provided by a modulo integrator 226 and a fixed frequency offset 222. The fixed frequency offset at the output of block 222 is integrated by integrator 226 and presented to the summer 228 as a phase ramp. This ramp signal in reality takes the shape of a saw tooth signal due to circuit limitations. The difference between this phase ramp and the phase output of the universal demodulator 216 is applied to the phase ramp detection and compensation circuit 224 as input 230. As will be detailed in association with FIG. 3, the detection and compensation circuit 224 switches the phase ramp signal in order to avoid the need for infinite ramping or the infinite bits needed in a digital scheme. Output 223 from the compensation circuit 224 is then filtered at a loop filter 220 before being applied as a control signal to a VCO 218 which generates the local oscillator for the quadrature demodulator circuit. The intent is to force the VCO output to include an offset frequency so that when it is mixed at mixers 206 and 210 it produces a baseband signal with an offset sufficient to distinguish it from DC thereby avoiding false carrier or self quieting problems.

As it is known, if the local oscillator frequency is exactly the same as the carrier frequency of the antenna 202, the Inphase (I) and Quadrature (Q) phase signals contain precise cosine and sine at the phase information that can be recovered by the phase demodulator 216. In the presence of a frequency offset, an additional term appears in the argument of the cosine and sine terms that is proportional to the frequency offset ($\Delta f$). After phase demodulation, the phase offset ($2\pi \cdot \Delta f \cdot t$) can be used to correct the LO frequency and lock the LO to the incoming signal. To achieve phase locking with a frequency offset, a fixed frequency offset is generated at block 222 (in order of 100 Hz) and then integrated to create the phase ramp or other wise a phase offset. This phase ramp is then subtracted from the phase offset information and is applied to the VCO 218. With no phase wrap detection and compensation, whenever a phase wrap occurs (this may be due to finite voltage swing or finite number of bits available), the control voltage to the VCO 218 loses its nominal lock position (after having acquired lock). In addition to loss of phase lock, this will cause distortions in the demodulator output. The phase wrap detection and compensation circuit 224 is added to the loop to overcome this problem. This circuit detects the phase wrapping every time it occurs and compensates for it to avoid circuit instability.

Figure 3:
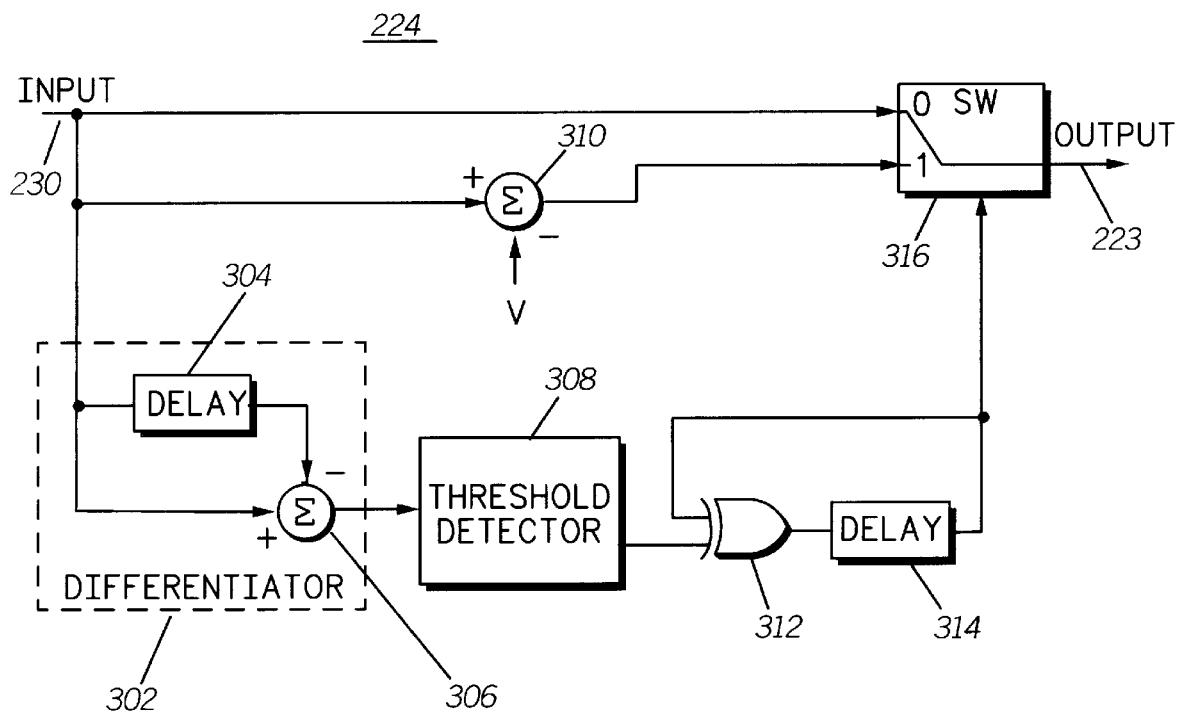
FIG. 3 shows the details of a phase wrapped detection compensation circuit in accordance with the present invention.

Referring to FIG. 3, the components of the phase wrap detection and compensation circuit 224 are shown. Input signal 230 is applied to a switch 316 having two positions. In a first position, the input 230 is directly coupled to the output 223. This position is assumed when no wrapping has been detected and as such the loop operates as if the detection circuit 224 is absent. The input 230 is also coupled to a summer 310 and to a differentiator 302. The differentiator 302 computes the rate of change of the input from one sample to the next. To accomplish this task, a summer 306 is included in a loop with a delay 304. This rate of change is applied to a threshold detector 308 that outputs a 1 every time the input is above a desired threshold (V). Therefore, this acts as a phase wrap detector which every time the VCO control voltage goes through a warp around, the control voltage gets corrected by subtracting voltage V therefrom. This voltage V is equal to the level of voltage that the input 230 suffers as a result of a wrap as generated by the phase ramp. The threshold detector 308 is coupled to an EXOR 312 looped in by a delay 314 to provide the control for the switch 323.

By utilizing this detection and compensation circuit whenever a wrap occurs in the input 230, such wrap is detected through the threshold detector and the switch 323 couples a compensated voltage to the output 223. As such, the loop filter 220 does not see a wrap and continues to operate as if no wrap in the phase ramp occurred. In other words, a virtual perpetual ramp is created in so far as the loop filter 220 is concerned. With this mechanism, the loop lock is not lost when the phase ramp wraps around.

In summary, to avoid having to up-convert in a zero IF environment, the present invention generates an offset to the local oscillator of the ZIF converter in order to shift the output of the ZIF converter to facilitate the removal of DC components through a high pass filter. The mechanism outlined here detects the wrapping by of the phase ramp representative of a fixed frequency offset before it can get to the VCO 218 and thereby throwing the phase-locked loop out of lock. This detection and compensation of the wrapping is accomplished via using a threshold detector which causes a switch to flip between the phase ramp and a fixed signal at the instant phase wrap occurs. As such, a direct conversion receiver may be realized whereby the local oscillator signal includes an offset sufficient to allow for the removal of DC components that would otherwise generate false carriers or self-quieting problems. It is now possible, utilizing the phase wrap detection and compensation circuits of the present invention, to realize a phase-locked loop circuit having an output with an offset frequency. The offset frequency may be used for a number of practical applications including when locally generated DC conditions could potentially interfere with the direct converted signal.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. In a baseband receiver having a phase locked loop, a method of phase locking with a frequency offset, comprising:

providing a baseband signal having a phase information portion and an initial frequency offset;

generating a sawtooth signal representing a desired frequency offset;

detecting when the sawtooth signal is at a maximum level; and compensating for the expected drop in the sawtooth signal in order to generate a phase offset while avoiding loop instability which occur when a ramp has occurred.

2. A baseband receiver, comprising:

a baseband converter;

a local oscillator coupled to the converter having a frequency offset a baseband demodulator;

a phase locked loop coupled between the baseband demodulator and the baseband converter for stabilizing the frequency offset;

a phase ramp generator coupled to the phase locked loop to introduce a phase offset thereto;

a frequency offset generator to introduce a fixed frequency offset in the phase locked loop;

a compensation circuit coupled to the phase ramp generator to detect and compensate for phase ramp generator deficiencies; and a loop filter coupled to the output of the compensation circuit.

3. A baseband receiver having a phase locked loop (PLL) capable of locking to a desired frequency to produce a reference signal having a frequency offset, the PLL comprising:

a forward loop, comprising:
  an input;
  a phase detector;
  a ramp generator for generating a ramp signal;
  a phase compensation circuit, comprising:
    a threshold detector to detect when an abrupt change in the ramp signal has occurred;
    a compensator responsive to the threshold detector to neutralize the effects of the abrupt change in the ramp signal when a ramp has occurred;
  a loop filter coupled to the output of the phase compensation circuit;
  an oscillator coupled to the loop filter which generates the reference signal; and a feedback loop to feed back the reference signal to the phase detector.

4. The phase locked loop of claim 3, wherein the phase compensation circuit further includes a differentiator coupled to the threshold detector.

5. The phase locked loop of claim 3, wherein the phase compensation circuit further includes a switching block to switch between the ramp signal and a second signal.

6. The phase locked loop of claim 5, wherein the phase compensation circuit further includes a summer which generates the second signal.

7. The phase locked loop of claim 5, wherein the phase compensation circuit further includes a delay circuit coupled to the switching block to make for a smooth switching between the ramp signal and the second signal.

8. The phase locked loop of claim 7, wherein the delay circuit includes an EX-OR gate.

* * * * *